United States Patent [19]

Beadle

[11] Patent Number: 4,814,714

[45] Date of Patent: Mar. 21, 1989

[54] LONG TIME CONSTANT INTEGRATING CIRCUIT

[75] Inventor: Edward R. Beadle, Commack, N.Y.

[73] Assignee: Hazeltine Corporation, Greenlawn, N.Y.

[21] Appl. No.: 82,712

[22] Filed: Aug. 7, 1987

[51] Int. Cl.⁴ .......................... H03K 6/04; H03K 4/06

[52] U.S. Cl. .................................... 328/127; 328/151; 307/352; 307/49 D

[58] Field of Search ............... 307/490, 494, 498, 501, 307/529, 352, 353; 328/127, 128, 151, 156, 158; 330/252

[56] References Cited

U.S. PATENT DOCUMENTS

| | | | |
|---|---|---|---|
| 3,740,586 | 6/1973 | Banks et al. | 328/151 |
| 3,879,724 | 4/1975 | McDonald | 328/158 |
| 3,927,378 | 12/1975 | Fjällbrant | 328/151 |
| 4,160,922 | 7/1979 | Rickenbacker | 328/151 |
| 4,390,844 | 6/1983 | Ting | 328/151 |
| 4,511,852 | 4/1985 | Henrich et al. | 330/252 |

*Primary Examiner*—John S. Heyman
*Attorney, Agent, or Firm*—E. A. Onders

[57] ABSTRACT

A method and apparatus for performing integration using a circuit capable of integrating an input signal over a wide linear dynamic range. The circuit modulates the input signal with a biphase signal having positive and negative phases. The modulated signal is then provided to an integrator. The integrator operates continuously within its linear range without needing charge dumping because the amplitude of the modulated signal is less than the amplitude required to saturate the integrator. Each interval of the integrated signal corresponding to positive and negative phases of the biphase signal is then partitioned into intervals corresponding to the positive phase and intervals corresponding to the negative phases by two track and hold circuits with alternating tracking and holding periods. The signal intervals corresponding to the negative phase of the biphase signal are subtracted from the intervals corresponding to the positive phases by a differential amplifier. These subtracted intervals are then added together by a sample-and-hold circuit joined with a summing circuit to produce the integrated signal corresponding to the linear integration of the input signal. The circuit is thus the mathematical equivalent of dividing the desired period of integration into a finite number of intervals, integrating each interval over that subdivided portion of the desired integration period, then adding the integrals of the intervals which equals the integral over the desired integration period. The frequency of the biphase signal can be adjusted so that integration of the subdivided portions of the desired period of integration requires capacitors sizes capable of being incorporated onto an integrated circuit.

12 Claims, 4 Drawing Sheets

LONG TIME CONSTANT INTEGRATING CIRCUIT

BACKGROUND OF THE INVENTION

1. Field of the Invention

The invention relates generally to long time-constant integrating circuits providing an adjustable integration period utilizing capacitors of a size suitable for incorporation in an integrated circuit, with the integrating circuit being capable of performing over a wide linear dynamic range with gain.

2. Description of the Prior Art

A particularly useful circuit required in many communication applications is the integrating circuit which performs the mathematical operation of integration. There are many conventional integrating circuits, three of which are illustrated in FIGS. 1A, 1B and 1C. These circuits have been successfully used commercially. However, each of these only approximates the integration operation over a limited period of time.

Further, these circuits cannot adjust the total integration time without using additional hardware such as resistors, capacitors, switches and control circuitry. In addition to the cost increase due to this additional hardware, adjustable circuits fashioned in such a manner will exceed most communication specifications which require compact, lightweight circuitry.

As shown in FIG. 1A, a basic integrating circuit consists of a resistor R and a capacitor C and provides a limited version of the operation of mathematical integration. This is demonstrated by examining the output of the circuit in FIG. 1A, in response to an input such as a voltage step input. The following formula gives the value of the output voltage $V_{out}$ as a function of the time t, where t is the time base in seconds after the rising edge of the input step is applied, and as a function of the amplitude A of the step voltage applied as the input $V_{in}$.

$$V_{OUT}(t)=A(|-e^{-t/RC})t_{o}>t>0 \quad (1).$$

FIG. 2 graphically shows the response of the circuit in FIG. 1A. The step voltage applied as $V_{in}$ is represented by curve 30. Curve 31 represents $V_{out}$ (t) in circuit 1A and approximates the output of an ideal integrator, curve 32, when t is close to zero. Capacitor C must have a breakdown voltage greater than $V_{in}$ to prevent a discharge. Alternatively, the period of integration must be less than the time capacitor C requires to reach a fully charged condition. Curve 33, which is a graphical representation of the following formula, shows that the circuit 1A requires time to discharge:

$$V_{OUT}(t)=Ae^{-(t-to)/RC}t>t_{o} \quad (2).$$

Therefore, the prior art circuit of FIG. 1A has limited applicability due to the limitations on capacitor size and integration period. Furthermore, during the discharge time represented by Curve 33, the circuit is useless for performing the integration function.

While the prior art integration circuit in FIG. 1B provides a closer approximation of an ideal integrator, this circuit is also limited. Long time-constants for this circuit require proportionately large capacitors and resistors. This is a particular problem with integrated circuits in that the maximum size capacitor capable of being fabricated internally on a chip is of the order of tens of picofarads. Similarly, the maximum resistor size on an IC is a few kiloohms. Capacitors of that size yield time-constants which are insufficient in length for most communication applications. Also, the useful output of the circuit is inversely proportional to the size of the capacitors and resistors.

The circuit of FIG. 1B also suffers, as the circuit of FIG. 1A, from requiring time to discharge in which the integration function cannot be performed. In order to decrease this discharge time, most integration circuits shunt a low resistance across the capacitor. It is not practical to reduce this resistor below a value of tens of ohms, which still requires some recovery time.

One prior art solution is the use of at least two integrating circuits, so that one is operational while the other circuit is discharging. As this shunt resistance increases in value, for example, approximating the resistance R, in FIG. 1A or 1B, the required number of parallel integrating circuits likewise increases as shown by the following formula:

$$69\ R'/R+1=\eta \quad R'=\text{SHUNT RESISTANCE} \quad (3).$$

In this formula, $\eta$, when rounded to the next larger integer, gives the number of integrating circuits for an application requiring a 60 db linear dynamic range. Parallel integrating circuits require additional hardware for switching, control and discharge. This makes the circuits in FIGS. 1A and 1B impractical to incorporate into integrated circuits except in extremely limited applications.

The circuit in FIG. 1C illustrates a common base transistor circuit which functions as an integrator and provides a very close approximation of the ideal integrator. The bipolar junction transistor EBC shown in the circuit of FIG. 1C is redrawn to the equivalent circuit using hybrid parameters and is shown in FIG. 3. The emitter current is represented by $i_e$. The collector current is shown as $i_c$. The parameter $h_{ie}$ is equal to the short circuit input impedance. The parameter $h_{oe}$ is equal to the open circuit output admittance. As $1/h_{oe}$ approaches infinity, the circuit is representable as a current source feeding a capacitor, as described by the following formula, which is the mathematical representation of an ideal integrator:

$$V_{OUT}(t)=|/Ci_{c}(t)dt \quad (4)$$

The circuit in FIG. 1C is still vulnerable to the same problems of the circuits in FIGS. 1A and 1B such as saturating and, thus, producing non-linearities. The circuit in FIG. 1C must also be discharged before being usable again. The time-constant of the common base integrator in FIG. 1C is still directly proportional to the size of the capacitor C and, thus, is quite limited to those applications requiring only short time-constants if the required capacitor is to be included in the integrated circuit. Finally, the circuit in FIG. 1C cannot achieve variable integration time without using additional resistors, capacitors, switches and controls.

SUMMARY OF THE INVENTION

It is an object of this invention to provide a long time-constant integrating circuit having outputs which approach the mathematical equivalent of integration, yet using component parts including energy storage devices that can be fabricated entirely on a chip.

It is a further object of this invention to provide an integrating circuit with a long time-constant such that the invention can be used in applications requiring a wide linear dynamic range without requiring a plurality of parallel integrating circuits and the corresponding hardware for switching, control and discharge.

Another object of the invention is to provide a voltage gain of the outputs when compared to alternative prior art designs.

Finally, it is an object of this invention to provide a long time-constant integrating circuit that can be adjusted without additional resistors and capacitors in order to vary the integration interval and total integration time.

The invention comprises an apparatus that generates an output signal that closely approximates the mathematical operation of integration for an input signal.

A first means is provided for modulating the input signal with a biphase signal. The biphase signal has an alternating positive and negative phase which changes at a rate corresponding to a repeating period of T seconds. The first means has an input port for receiving the input signal. An output port of the first means provides a modulated output signal corresponding to the input signal modulated with the biphase signal.

A second means is provided for integrating the modulated output signal. The second means has an input port connected to the output port of the first means. An output port of the second means provides an integrated signal corresponding to the integrated, modulated output. The second means has a preferred period of time within which it operates. The preferred period is greater than T/2 seconds.

A third means is provided for sampling the integrated signal every T/2 seconds and holding the sampled, integrated signal for T/2 seconds. The held, sampled signal corresponding to the negative biphase period is subtracted from the preceeding held, sampled signal corresponding to the positive biphase period. The third means has an input port connected to the output port of the second means and has an output port for providing a subtracted signal corresponding to the sampled, held, and subtracted integrated signals.

A fourth means is provided for summing the subtracted signals. The fourth means has an input port connected to the output port of the third means. An output port of the fourth means provides the summed, subtracted signal whereby the summed, subtracted signal corresponds to the integrated input signal.

For a better understanding of the present invention, together with other and further objects, reference is made to the following description, taken in conjunction with the accompanying drawings, and its scope will be pointed out in the appended claims.

DETAILED DESCRIPTION OF THE INVENTION

Figure 5:
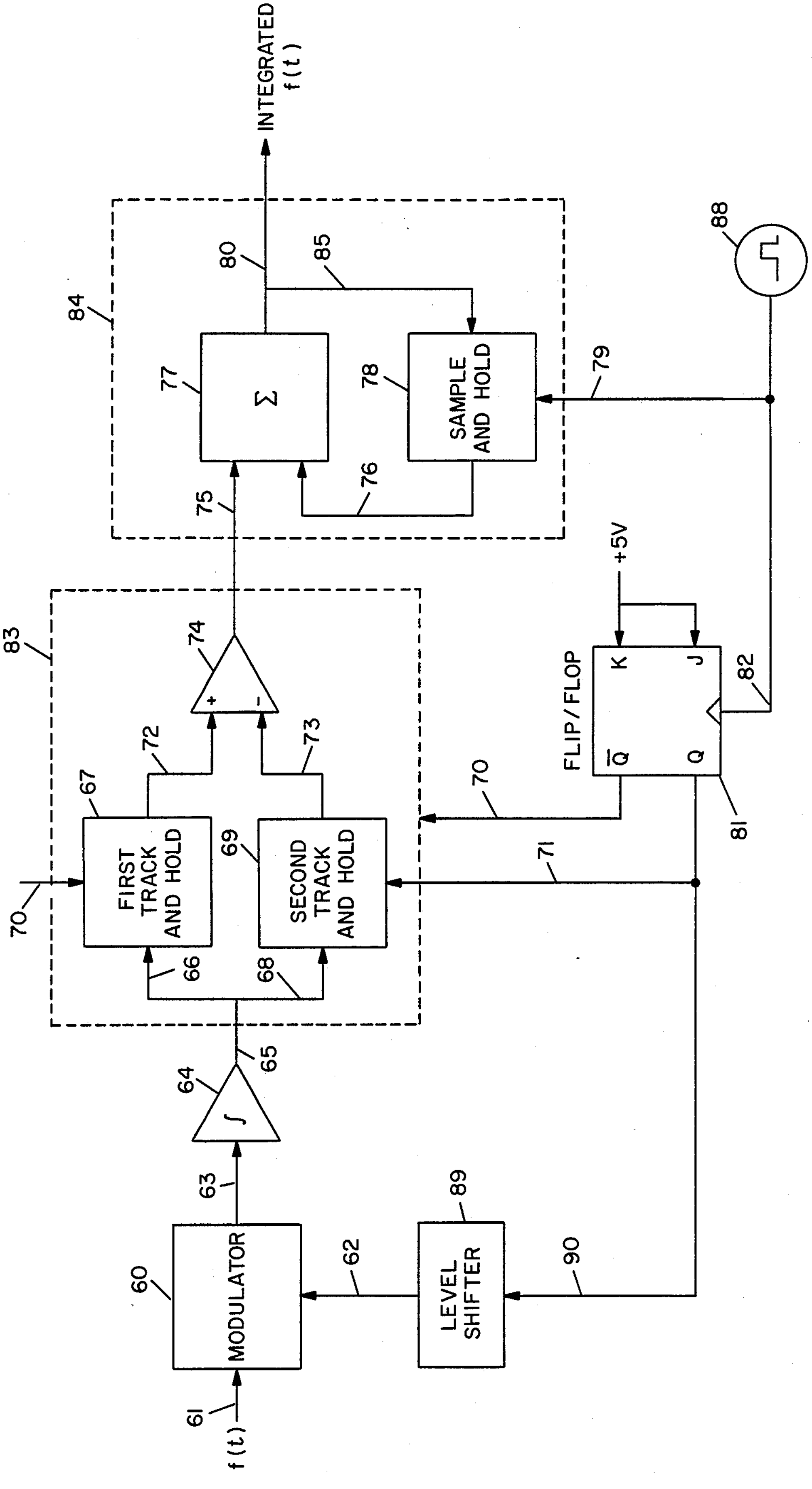
FIG. 5 is a block diagram of a long time constant integrator according to the invention.

FIG. 5 illustrates a block diagram of a circuit according to the invention. The square wave generator 88 provides a square wave signal adjusted to the desired amplitude required for modulator 60, adjusted to have a very narrow pulse width corresponding to the acquisition time of sample-and-hold (S/H) 78, and adjusted to a frequency that enables integrator 64 to remain operating in its linear range. Square wave generator 88 synchronizes modulator 60, first track-and-hold (T/H) 67, second T/H 69 via Flip/Flop 81 and S/H 78. The square wave signal is provided to FF 81 via line 82. FF 81 is configured so that during power-up, Q will be initialized with zero and not-Q ($\bar{Q}$) will be positive. The square wave signal at the Q port is provided via line 90 to level shifter 89 which changes the signal into alternating positive and negatives phases. This biphase timing signal is then provided to modulator 60 via line 62.

Biphase modulator 60 receives the input signal f(t) via line 61. The biphase signal is a signal having a period T formed by alternating positive phase 103 and negative phase 104. The input and biphase signals are mixed (i.e. multiplied, combined, or modulated) and provided at the output port 63 of biphase modulator 60. Output port 63 of modulator 60 is connected to the input port of integrator 64 which integrates the modulated signal and provides the integrated, modulated signal at its output port 65. Integrator 64 is any conventional integrating circuit having a linear operating range which is greater than T/2.

The integrated output signal is provided via line 66 to track-and-hold circuit 67 and via line 68 to track-and-hold circuit 69. Each track-and-hold circuit is a standard off-the-shelf circuit well known in the prior art. During tracking cycles, the output of the circuit corresponds to the input of the circuit. During holding cycles, the output of the circuit corresponds to the last tracked input immediately before the holding cycle began.

First track-and-hold (T/H) circuit 67 and second T/H circuit 69 are operated in synchronization with the biphase signal. This synchronization is provided by square wave generator 88. During positive phases 103, the signal provided via line 70 programs T/H 67 so that T/H 67 is operated in its tracking cycle. During negative phases 104, the signal provided via line 70 programs T/H 67 to operate in its holding cycle.

During positive phases 103, the signal provided via line 71 programs T/H 69 so that T/H 69 is operated in its holding cycle. During negative phases 104, the signal provided via line 71 programs T/H 69 to operate in its tracking cycle.

One apparatus for cycling T/H circuits 67 and 69 so that one is tracking while the other is holding is through the use of a commercially available clocked JK FF 81. FF 81 is clocked by a timing signal provided by square wave generator 88 via line 82. Positive 5 volts is applied to port J and K of FF 81. When J and K are both set high as shown, each clock pulse via line 82 wil toggle (reverse) both outputs Q and not-Q. The not-Q output of FF 81 is the inverse of the Q output of FF 81 which are fed to lines 70 and 71 respectively thus causing one T/H to be tracking while the other is holding.

The held, integrated signal corresponding to the positive phase of the biphase modulation is provided by the output of first T/H 67 via line 72 to the sum port of a differential amplifier 74. The held, integrated signal corresponding to the negative phase of the the biphase modulation is provided by the output of the second T/H circuit 69 via line 73 to the difference port of the differential amplifier 74. The subtracted signal corresponding to the difference between the positive and its preceeding negative phase of the integrated signals is provided by the output of amplifier 74 via line 75 to one input port of a summing circuit such as summing amplifier 77.

A feedback loop containing sample-and-hold (S/H) circuit 78 is connected across the summing amplifier 77. The output port 80 of the summing amplifier is connected via line 85 to the input port of the sample-and-hold circuit 78. The output port of the sample-and-hold circuit 78 is connected to the other input port of the summing amplifier 77 via line 76. The S/H 78 is synchronized with the biphase signal by the signal provided by square wave generator 88 via line 79 so that S/H 78 will sample at the end of each phase of the biphase signal and will hold throughout almost all of the next succeeding phase of the biphase signal. The sampling time must be extremely short when compared to the period of the biphase modulation so the held signal closely approximates the last value in line 85 at the moment before the phase changes. As long as the acquisition time of S/H 78 is very short, i.e. nanoseconds, no positive feedback as a consequence of S/H 78 being connected across summing amplifier 77 will occur during the brief sampling period. There are commercially available S/H that will meet this requirement. However, feedback during the sampling period can also be prevented by installing a delay either on line 76 or on line 85. The summing amplifier 77 outputs the integrated input signal f(t) corresponding to the summed, subtracted signal via line 80.

Figure 6:
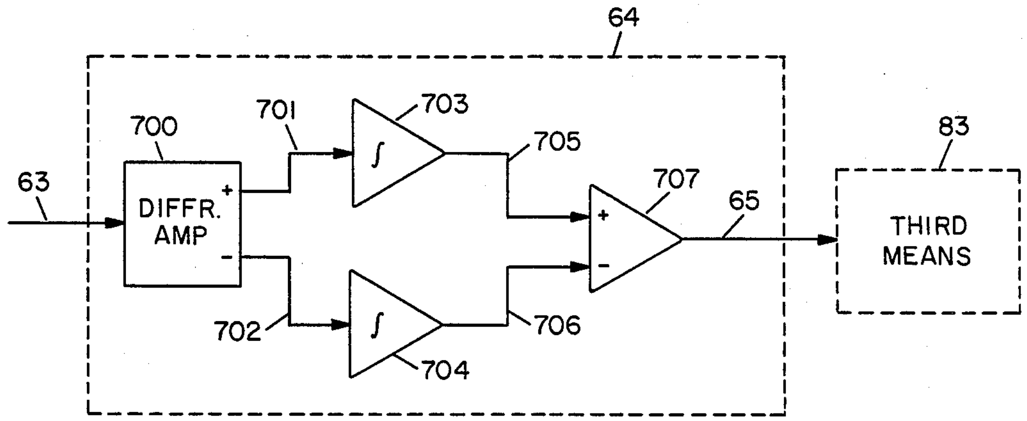
FIG. 6 is a block diagram of an alternate second means for integrator 64 according to the invention.

In the situation where the integrated input signal must be free of offset bias introduced by integrator 64 before it is integrated, the alternative embodiment of an integrating circuit 64 as shown in FIG. 6 would replace the integrator 64 in FIG. 5. As shown in FIG. 6, the modulated signal 63 is connected to a differential amplifier 700 such as disclosed in U.S. Pat. No. 4,511,852. A modulated signal corresponding to the modulated signal 63 is provided at output port 701 and is connected to a first integrator 703. An inverse of the modulated signal 63 is provided at output port 702 and is connected to a second integrator 704. An integrated signal corresponding to the integrated, modulated signal is provided at output port 705 and is connected to the sum port of the differential amplifier 707. The inverse integrated signal at the output port 706 is the inverse of the integrated signal at output port 705. The inverse integrated signal corresponds to the inverse of the integrated, modulated input signal and is connected to the differential port of the differential amplifier 707. Differential amplifier 707 subtracts the integrated signal from the inverse integrated signal, resulting in an integrated signal free from offset bias and twice the amplitude of the first integrated signal. If twice the value of the integrated signal is not required, then a voltage divider or similar means may be inserted in line 65 to return the integrated signal to the non-amplified value. The integrated signal is connected via line 65 to the third means 83 for partitioning the integrated signal into intervals.

In FIG. 5, the preferred embodiment of the third means 83 for partitioning the integrated signal into intervals is shown using track-and-hold circuits. However, sample-and-hold circuits could be used instead of each track-and-hold without altering the performance of the invention. If sample-and-hold circuits are substituted, then the apparatus for cycling the sample-and-hold circuits, corresponding to FF 81 in the case of the preferred embodiment of using track-and-hold circuits, would have to be modified corresponding to the characteristics of the sample-and-hold circuits selected. Each sample-and-hold circuit is a standard off-the-shelf circuit well known in the prior art.

The preferred embodiment of the fourth means 84 is shown using a sample-and-hold circuit 78 in combination with a summing circuit 77. A track-and-hold circuit cannot be substituted for the sample-and-hold circuit 78. Each of these circuits is also standard off-the-shelf circuits well known in the prior art.

OPERATION OF THE INVENTION

Figure 1A:
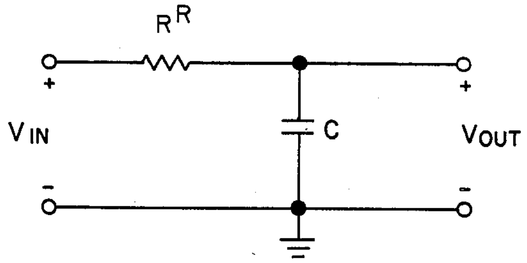
FIG. 1A PRIOR ART
FIGS. 1A, 1B and 1C are schematic diagrams of conventional integrators according to the prior art.
Figure 1B:
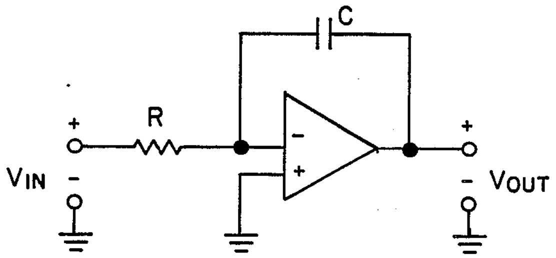
FIG. 1B PRIOR ART
Figure 1C:
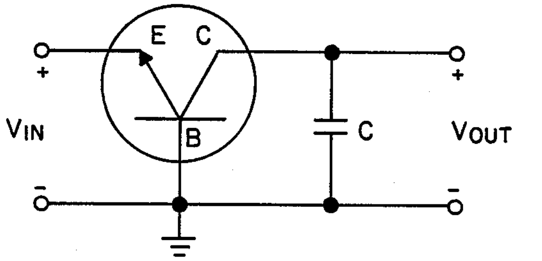
FIG. 1C PRIOR ART
Figure 2:
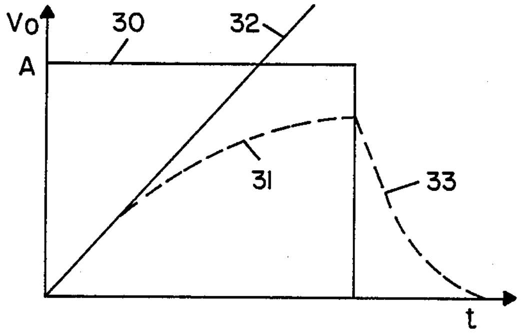
FIG. 2 is a graph showing the response of a non-ideal integrator to a step input.
Figure 3:
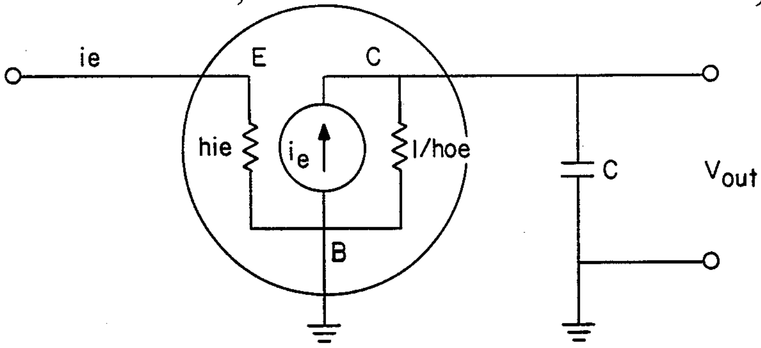
FIG. 3 is an equivalent diagram of the common base integrator illustrated in FIG. 1C.
Figure 4A:
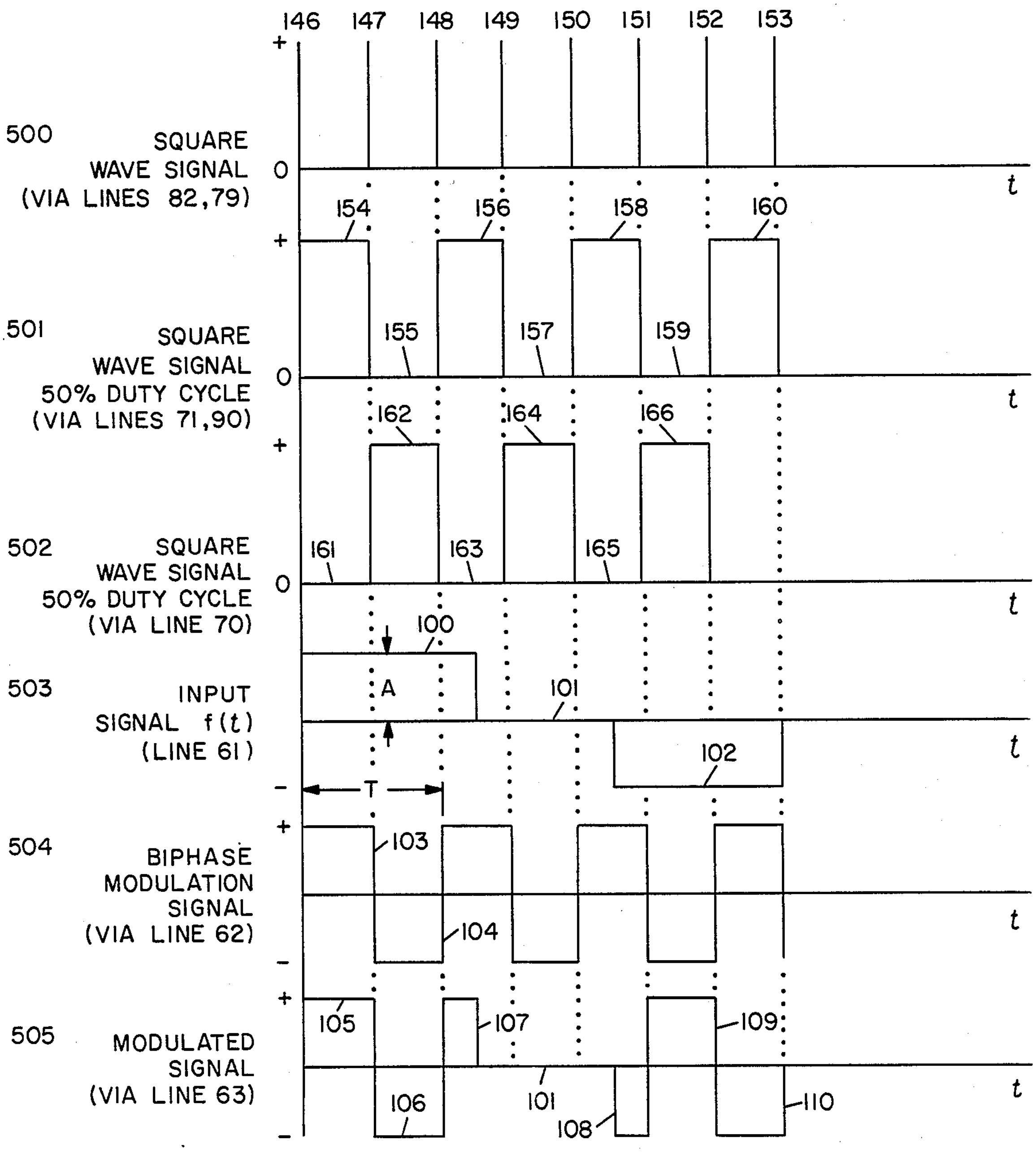
FIGS. 4A and 4B are timing diagrams showing, at various points, the response to a step input of a long time-constant integrator according to the invention.
Figure 4B:
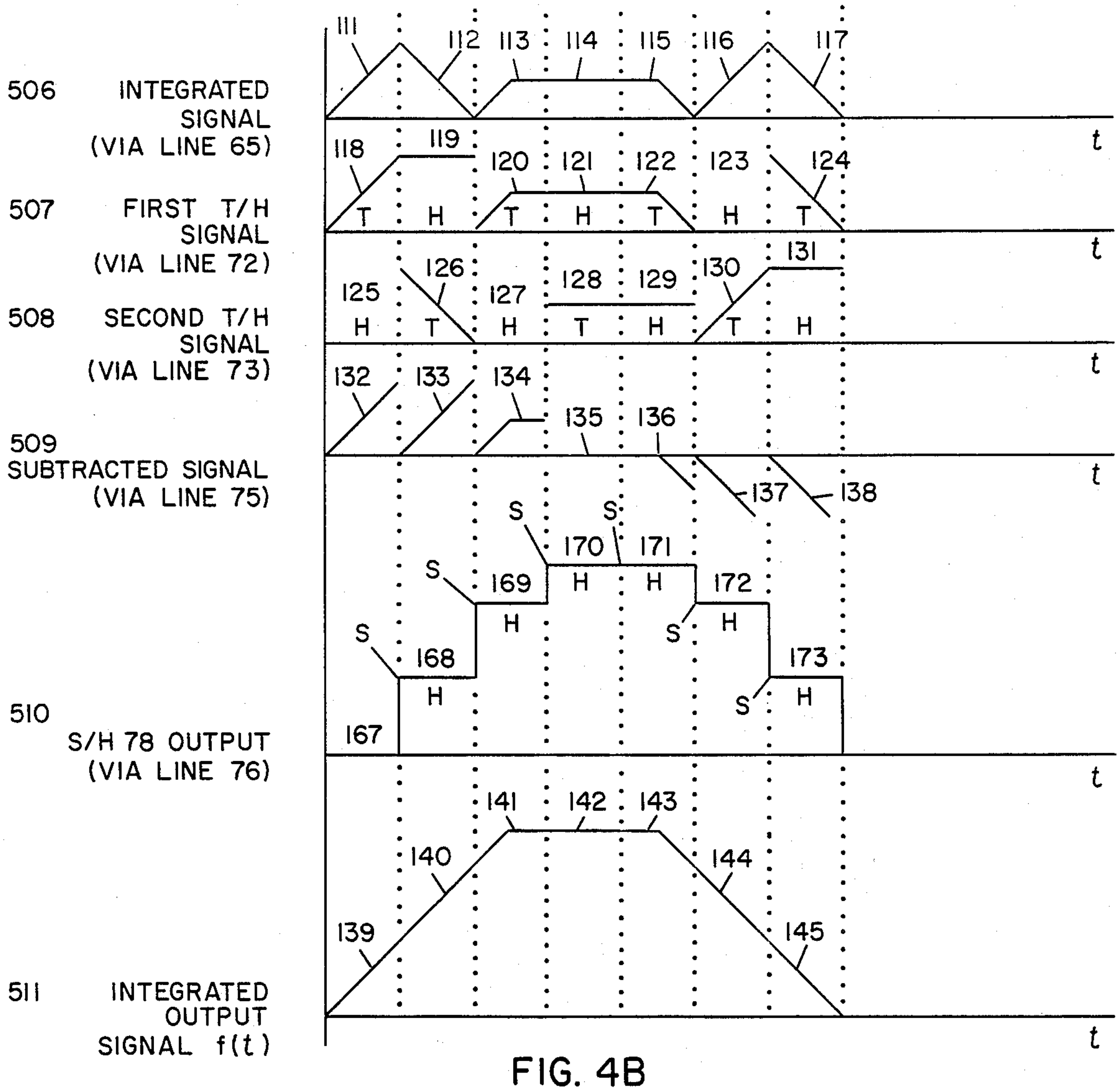

FIGS. 4A and 4B illustrate a timing diagram of the various signals which would be generated by the invention as illustrated in block diagram form in FIG. 5. Graph 503 in FIG. 4A illustrates the input signal which may be applied via line 61 to biphase modulator 60. As shown in FIG. 4, the input signal is assumed to be a step function of amplitude A comprising a positive step 100 followed by no signal 101 followed by a negative step 102 with a period of T.

Graph 500 illustrates the square wave signal provided by square wave generator 88 via lines 82 and 79. Pulses 146–153 occur every T/2 seconds with T/2 being much greater than the width of the pulses.

Graph 501 illustrates the output of FF 81 that is provided to level shifter 89 via line 90. The output is a series of positive steps 154, 156, 158, and 160 followed by zero steps, 155, 157 and 159 respectively. The width of each pulse is T/2 seconds.

Graph 504 illustrates the biphase signal with a period T provided by the level shifter via line 62 corresponding to the square wave signal with a 50 percent duty cycle provided by FF 81 via line 90. Graph 504 illustrates the biphase signal which is provided via line 62 for mixing with the input signal illustrated in Graph 503. The biphase signal is a series of alternating positive steps 103 and negative steps 104. The biphase signal is mixed (i.e. modulated) with the input signal to provide a modulated output signal via line 63.

Graph 503 illustrates the modulated output signal that is provided to the integrator 64 via line 63. The period T of the biphase signal provided via line 62 and as illustrated in graph 504 is selected such that T/2 enables the integrator 64 to be operated continously without exceeding its linear operating range.

In graph 505, positive steps 105, 107 and negative step 106 result from mixing the positive input step 100 with the alternating positive steps 103 and negative steps 104 of the modulating signal. Between steps 107 and 108, no signal 101 is provided and corresponds to no signal 101 in graph 503. Negative step 102 now corresponds to negative steps 108, 110 and positive step 110.

Graph 506 in FIG. 4B illustrates the continuous operation of integrator 64 and its corresponding output provided via line 65. The signal corresponding to the integral of positive step 105 is positive slope 111. The signal corresponding to the integral of negative step 106 is negative slope 112. Similarly, positive slope 113 corresponds to the integral of positive step 107. Zero slope 114 corresponds to the integral of no signal 101. Negative slope 115 corresponds to the integral of negative step 108. Positive slope 116 corresponds to the integral of positive step 109. Negative slope 117 corresponds to the integral of negative step 110.

As long as integrator 64 is within its preferred operating period, integrator 64 will operate continuously and linearly as shown without needing periodic charge dumping and resetting. The maximum absolute value of the amplitude of any integrated intervals resulting from the positive and negative phases of the modulating signal illustrated by slopes 111 through 117 in graph 506 must be less than the amplitude required to cause integrator 64 to be driven into a non-linear operating range.

Graphs 507 illustrates the partitioning of the integrated signal via line 65 into a first T/H signal provided via line 72 corresponding to the intervals of integration occurring during positive phases of the biphase signal and into a second T/H signal provided via line 73 corresponding to the intervals of integration occurring during negative phases of the biphase signal.

Each interval of Graph 507 labeled T correspond to a positive phase of the biphase signal. Each interval of Graph 507 marked H corresponds to a negative phase of the biphase signal. The intervals marked T correspond to T/H 67's tracking periods for T/2 seconds. The intervals marked H correspond to T/H 67's holding periods for T/2 seconds. The timing signal which is the square wave signal illustrated by Graph 502 in FIG. 4A and provided by line 70 causes T/H to alternatingly track then hold every T/2 seconds. Zero steps 160, 163, and 165 illustrated in Graph 502 provide tracking intervals 118, 120, and 122 illustrated in Graph 507 in FIG. 4B. Correspondingly, positive steps 162, 164, and 166 illustrated in Graph 502 in FIG. 4A cause T/H 67 to hold which is illustrated by holding intervals 119, 121, and 123 in Graph 507 in FIG. 4B.

The tracking periods in Graph 507 are positive slope 118 which corresponds to positive slope 111; positive and level slope 120 corresponds to positive slope 113; level and negative slope 122 corresponds to positive slope 115, and negative slope 124 corresponds to negative slope 117. Zero slopes 119, 121, 123 correspond to the holding period of T/2 seconds which immediately follows the tracking period of T/2 seconds. Graph 507 illustrates by zero slopes 119, 121, and 123 that the amplitude immediately tracked at the ending of the first T/2 seconds is held for T/2 seconds.

Similarly Graph 508 illustrates the partitioning of the integrated signal provided via line 65 into second T/H signal corresponding to the output of T/H 69 provided at line 73. Each interval of Graph 508 marked T corresponds to a negative phase of the biphase signal. Each interval of Graph 508 marked H corresponds to a positive phase of the biphase signal. The intervals marked T correspond to T/H 69's tracking periods for T/2 seconds. The intervals marked H correspond to T/H 69's holding periods for T/2 seconds. The square wave signal illustrated by Graph 501 in FIG. 4A and provided by line 71 causes T/H to alternatingly track then hold every T/2 seconds. Zero steps 155, 157, and 159 illustrated in Graph 501 in FIG. 4A provide tracking intervals 126, 128, and 130 illustrated in Graph 508 in FIG. 4B. Correspondingly, positive steps 155, 156, and 158 illustrated in Graph 501 in FIG. 4A cause T/H 69 to hold which is illustrated by holding intervals 125, 127, and 129 in Graph 508 in FIG. 4B.

The tracking periods in Graph 508 are negative slope 126 which corresponds to negative slope 112, zero slope 128 corresponds to zero slope 114, and positive slope 130 corresponds to positive slope 116. Zero slopes 127, 129, and 131 correspond to the holding period of T/2 seconds which immediately follows the tracking period of T/2 seconds. Again, as in Graph 507, the amplitude that is tracked immediately at the end of the first T/2 seconds is held for the next T/2 seconds. Graph 508 illustrates the signal that is provided by line 73.

Graph 509 illustrates the subtracted signal provided via line 75 that is provided at the output of differential amplifier 74. Positive slope 132 corresponds to the signal obtained when zero slope 125 is subtracted from positive slope 118. Positive slope 133 corresponds to the signal obtained when negative slope 126 is subtracted from zero slope 119. Positive slope 134 corresponds to the signal obtained when zero slope 127 is subtracted from positive slope 120. Zero slope 135 corresponds to the signal obtained when zero slope 128 is subtracted from zero slope 121. Negative slope 136 corresponds to the signal obtained when zero slope 129 is subtracted from negative slope 122. Negative slope 136 corresponds to the signal obtained when positive slope 130 is subtracted from zero slope 123. Negative slope 138 corresponds to the signal obtained when zero slope 131 is subtracted from negative slope 124.

Graph 511 illustrates the integrated output signal corresponding to the integral of f(t). The signal provided at the output of the differential amplifier 74 is combined using the summing amplifier 77 and S/H 78. S/H 78 is timed via line 79 and as shown in Graph 500 in FIG. 4A to sample the signal at the end of the first T/2 seconds and hold that value for T/2 seconds. Thus, pulse 146 shown in Graph 500 causes the signal provided by line 85 to be held which corresponds to zero slope 167 in Graph 510 in FIG. 5B. Pulse 147 causes the S/H 78 to hold zero slope 168. Similarly, pulse 148 corresponds to zero slope 169, pulse 149 corresponds to zero slope 170, pulse 150 corresponds to zero slope 171, pulse 151 corresponds to zero slope 172, and pulse 152 corresponds to zero slope 173. As shown in Graph 510 designated by S, the sample period caused by the pulses 146–152 in Graph 500 in FIG. 4A represent a very short time interval. Therefore, the value present in summing amplifier 77 provided by line 85 at the time of phase shift of the biphase signal is held, designated as H in Graph 510 in FIG. 4B, until the next succeeding phase shift of the biphase signal.

Thus, interval 139 is obtained by adding zero slope 167 to the positive slope 132 in summing amplifier 77. Interval 140 is obtained by adding the value sampled at the end of T/2 seconds from positive slope 139 which corresponds to zero slope 168 to positive slope 133. Interval 141 is obtained by adding the value sampled at the end of T/2 seconds from interval 140 which corresponds to zero slope 169 to positive slope 134. Interval 142 is obtained by adding the value sampled at the end of T/2 seconds from interval 141 which corresponds to 170 to zero slope 135. Interval 143 is obtained by adding the value sampled at the end of T/2 seconds from interval 142 which corresponds to zero slope 171 to negative slope 136. Interval 144 is obtained by adding the value sampled at the end of T/2 seconds from interval 143 which corresponds to zero slope 172 to negative slope 137. Interval 145 is obtained by adding the value sampled at the end of T/2 seconds from interval 144 which corresponds to zero slope 173 to negative slope 138. Thus the integration of the input signal f(t) is provided at output port 80 which is the mathematical equivalent of the following equation:

$$\int_{t_0}^{t_n} f(t)dt = \int_{t_0}^{t_1} f(t)dt + \int_{t_1}^{t_2} f(t)dt + \int_{t_{n-1}}^{t_n} + f(t)dt \quad (5)$$

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. An apparatus for integrating an input signal comprising:
   - (a) first means for modulating the input signal with a biphase signal having an alternating positive and negative phase which changes at a rate corresponding to a repeating period of T seconds, said first means having an input port for receiving the input signal and an output port for providing a modulated output signal corresponding to the input signal modulated with the biphase signal;
   - (b) second means for integrating the modulated output signal, said second means having a preferred period of time within which it operates, said preferred period being greater than T/2 seconds, said second means having an input port connected to the output port of the first means and having an output port for providing an integrated signal corresponding to the integrated, modulated output signal;
   - (c) third means for sampling every T/2 seconds the integrated signal and for holding said sampled, integrated signal for T/2 seconds wherein said held, sampled signal corresponding to the negative biphase period is subtracted from the preceeding held, sampled signal corresponding to the positive biphase period, said third means having an input port connected to the output port of the second means and having an output port for providing a subtracted signal corresponding to the sampled, held and subtracted integrated signals; and
   - (d) fourth means for summing the subtracted signals, said fourth means having an input port connected to the output port of the third means and having an output port for providing the summed, subtracted signal corresponding to the integrated input signal.

2. The apparatus of claim 1 wherein said third means comprises:
   - a first track and hold circuit tracking the integrated signal for T/2 seconds and holding the tracked signal for T/2 seconds, said first circuit having an input port corresponding to the input port of the third means and having an output port;
   - a second track and hold circuit tracking the integrated signal for T/2 seconds and holding the tracked signal for T/2 seconds, said second circuit having an input port corresponding to the input port of the third means and having an output port;
   - a differential amplifier having a sum port connected to the output port of the first track and hold circuit, having a difference port connected to the output of the second track and hold circuit and having an output port corresponding to the output port of the third means; and
   - means, connected to the first and second track-and-hold circuits, for programming the first and second track-and-hold circuits such that the first track-and-hold circuit is programmed to track during positive biphase signal phases and the second track-and-hold circuit is programmed to track during negative biphase signal phases.

3. The apparatus of claim 2 wherein said fourth means comprises:
   - a summer having a first input port connected to the output port of the third means, a second input port and an output port corresponding to the output port of the fourth means;
   - a sample-and-hold circuit having an input port connected to the output port of the summer and having an output port connected to the second input port of the summer; and
   - means, connected to the sample-and-hold circuit, for resetting the sample-and-hold circuit after positive and negative biphase signal phases.

4. The apparatus of claim 3 wherein said first means comprises a mixer; wherein means for resetting comprises a square wave generator having an output connected to the sample-and-hold circuit; and wherein said means for programming comprises a flip-flop having first and second outputs connected to the first and second track-and-hold circuits, respectively.

5. The apparatus of claim 4 further comprising a level shifter connected to the first output of the flip-flop for generating the biphase signal.

6. The apparatus of claim 3 wherein said second means comprises a common base, bipolar junction, transistor circuit.

7. The apparatus of claim 1 wherein second means comprises a common gate gallium arsenide integrator circuit.

8. The apparatus of claim 1 wherein said fourth means comprises:
   - a summer having a first input port connected to the output port of the third means, a second input port and an output port corresponding to the output port of the fourth means;
   - a sample-and-hold circuit having an input port connected to the output port of the summer and having an output port connected to the second input port of the summer; and
   - means, connected to the sample-and-hold circuit, for resetting the sample-and-hold circuit after positive and negative biphase signal phases.

9. The apparatus of claim 1 wherein second means comprises a first integration circuit for integrating the positive phase of the modulated output signal and a second integration circuit for integrating the negative phase of the modulated output signal, the output of said first and second integration circuits connected to a sum input port and a difference port, respectively, of a differential amplifier which subtracts the negative phase from the positive phase and provides the subtracted result to the third means.

10. The apparatus of claim 1 wherein said second means comprises an integrator having a time constant of at least 20 microseconds.

11. A method for integrating an input signal comprising the steps of:
   - (a) modulating the input signal with a biphase signal having an alternating positive and negative phase which changes at a rate corresponding to a repeating period of T seconds;

(b) integrating the modulated output signal within a preferred period, said preferred period being greater than T/2 seconds;

(c) sampling the integrated signal every T seconds;

(d) summing the sampled signals whereby the sum of the sampled signals corresponds to the integrated input signal.

12. The method of claim 11 wherein said step of sampling comprises the steps of:

a first step of tracking and holding the integrated signal such that tracking occurs during positive biphase signal phases and holding occurs during negative biphase signal phases;

a second step of tracking and holding the integrated signal such that tracking occurs during negative biphase signal phases and holding occurs during positive biphase signal phases; and subtracting the tracked and held signal of the second step from the tracked and held signal of the first step.

* * * * *